(12) United States Patent
Oota

(10) Patent No.: US 11,753,553 B2
(45) Date of Patent: Sep. 12, 2023

(54) CARBON NANOTUBE WATER DISPERSION, CONDUCTIVE FILM, ELECTRODE, AND SOLAR CELL

(71) Applicant: ZEON CORPORATION, Tokyo (JP)

(72) Inventor: Ryuji Oota, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 17/756,051

(22) PCT Filed: Nov. 16, 2020

(86) PCT No.: PCT/JP2020/042667
§ 371 (c)(1),
(2) Date: May 16, 2022

(87) PCT Pub. No.: WO2021/106660
PCT Pub. Date: Jun. 3, 2021

(65) Prior Publication Data
US 2022/0389239 A1     Dec. 8, 2022

(30) Foreign Application Priority Data

Nov. 28, 2019  (JP) ................. 2019-215606

(51) Int. Cl.
| | |
|---|---|
| C09D 5/24 | (2006.01) |
| C09D 7/65 | (2018.01) |
| C09D 7/20 | (2018.01) |
| C09D 7/43 | (2018.01) |
| C09D 7/45 | (2018.01) |
| H01G 9/20 | (2006.01) |

(52) U.S. Cl.
CPC ............. *C09D 5/24* (2013.01); *C09D 7/20* (2018.01); *C09D 7/43* (2018.01); *C09D 7/45* (2018.01); *C09D 7/65* (2018.01); *H01G 9/2022* (2013.01); *H01G 9/2059* (2013.01)

(58) Field of Classification Search
CPC ... C09D 5/24; C09D 7/20; C09D 7/43; C09D 7/45; C09D 7/65; H01G 9/2022; H01G 9/2059; H10K 85/221; Y02E 10/542
See application file for complete search history.

(56) References Cited

U.S. PATENT DOCUMENTS

2012/0153235 A1* 6/2012 Ma .................. H01G 11/24
                                                252/502

FOREIGN PATENT DOCUMENTS

JP      2015146338 A     8/2015

OTHER PUBLICATIONS

May 17, 2022, International Preliminary Report on Patentability issued in the International Patent Application No. PCT/JP2020/042667.

* cited by examiner

*Primary Examiner* — Mark Kopec
*Assistant Examiner* — Jaison P Thomas
(74) *Attorney, Agent, or Firm* — KENJA IP LAW PC

(57) ABSTRACT

Provided is a carbon nanotube water dispersion with which it is possible to form a conductive film that has excellent film strength and can cause a solar cell to display excellent conversion efficiency and reliability. The carbon nanotube water dispersion is for an electrode of a solar cell that includes an electrolyte solution containing a polar aprotic substance as a solvent and contains carbon nanotubes, a dispersant, a thickener, and water. The dispersant is soluble in the solvent and the thickener is insoluble in the solvent.

7 Claims, 1 Drawing Sheet

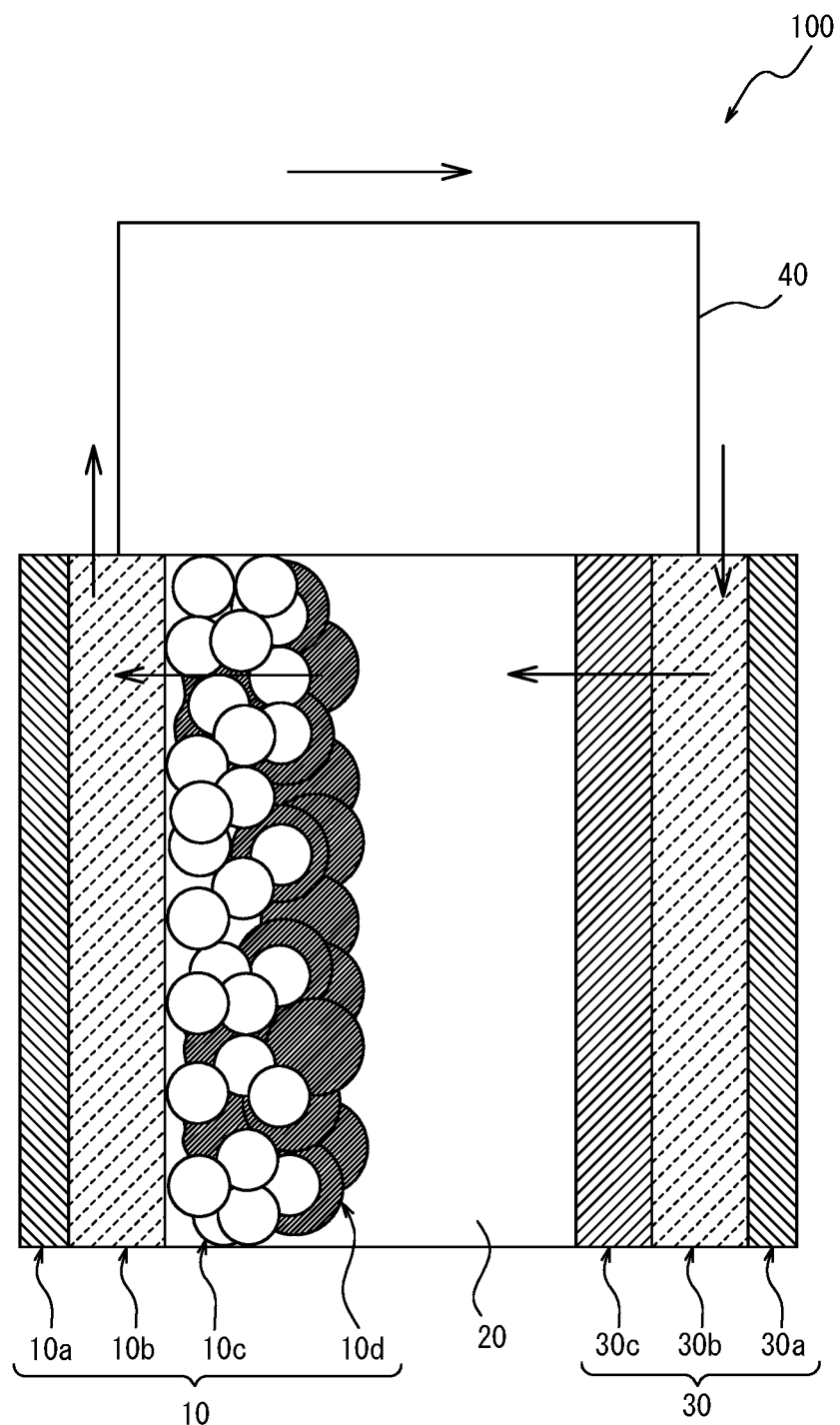

CARBON NANOTUBE WATER DISPERSION, CONDUCTIVE FILM, ELECTRODE, AND SOLAR CELL

TECHNICAL FIELD

The present disclosure relates to a carbon nanotube water dispersion, a conductive film, an electrode, and a solar cell.

BACKGROUND

A variety of industrial applications have been investigated for carbon nanotubes (hereinafter, also referred to as "CNTs") due to CNTs excelling in terms of various characteristics such as electrical conductivity, thermal conductivity, and mechanical strength. For example, techniques for forming conductive films using CNTs have been studied with focus on the excellent electrical conductivity of CNTs.

A CNT-containing conductive film can, for example, be formed on a substrate by applying a carbon nanotube water dispersion (hereinafter, also referred to as a "CNT water dispersion") that contains CNTs, a dispersant, and water onto the substrate and then drying the CNT water dispersion. The conductive film that is obtained in this manner may be used to produce an electrode of a solar cell such as a dye-sensitized solar cell.

For example, in Patent Literature (PTL) 1, a CNT water dispersion is applied onto and dried on a substrate to form a first carbon layer, a CNT water dispersion is then further applied onto and dried on the obtained first carbon layer to form a second carbon layer, and the obtained second carbon layer is washed with water or the like so as to at least partially remove a dispersant from the second carbon layer and thereby form a conductive laminate including a conductive film. According to PTL 1, the conductive laminate obtained through the steps described above has excellent electrical conductivity and can cause a dye-sensitized solar cell to display excellent conversion efficiency as a result of the dispersant, which acts as a resistive component, being removed by washing.

CITATION LIST

Patent Literature

PTL 1: JP2015-146338A

SUMMARY

Technical Problem

However, with the conventional technique described above, there are instances in which film strength of the conductive film is lost during washing and in which problems such as the formation of pinholes and peeling from a substrate arise. Moreover, when using an electrode that includes a conductive film in which film strength has been lost in this manner, it is difficult to cause a solar cell to sufficiently display excellent conversion efficiency while also maintaining this excellent conversion efficiency over a long period (i.e., ensuring reliability).

Accordingly, one object of the present disclosure is to provide a carbon nanotube water dispersion with which it is possible to form a conductive film that has excellent film strength and can cause a solar cell to display excellent conversion efficiency and reliability.

Another object of the present disclosure is to provide a conductive film that has excellent film strength and can cause a solar cell to display excellent conversion efficiency and reliability.

Another object of the present disclosure is to provide an electrode that can cause a solar cell to display excellent conversion efficiency while also ensuring reliability of the solar cell.

Another object of the present disclosure is to provide a solar cell that has excellent conversion efficiency and reliability.

Solution to Problem

The inventor conducted diligent studies with the aim of achieving the objects set forth above. The inventor firstly focused on the properties of a dispersant in a polar aprotic substance that is used as a solvent in an electrolyte solution of a solar cell. The inventor then focused on the fact that when a dispersant that can readily dissolve in a polar aprotic substance used as a solvent in an electrolyte solution of a solar cell is used to produce a CNT water dispersion, it is possible to remove the dispersant, which is a resistive component, from an obtained conductive film by causing the dispersant to elute into the electrolyte solution, even in a situation in which excessive washing (or washing itself) is not performed with respect to the conductive film. As a result of further extensive studies, the inventor discovered that by including, in a CNT water dispersion, a thickener that does not readily dissolve in a polar aprotic substance used as a solvent such as described above, this thickener can display binding capacity in a conductive film that is incorporated into a solar cell and can thereby inhibit detachment of the conductive film from a substrate and improve conversion efficiency and reliability of the solar cell. In this manner, the inventor completed the present disclosure.

Specifically, the present disclosure aims to advantageously solve the problem set forth above, and a presently disclosed carbon nanotube water dispersion is for an electrode of a solar cell that includes an electrolyte solution containing a polar aprotic substance as a solvent and comprises carbon nanotubes, a dispersant, a thickener, and water, wherein the dispersant is soluble in the solvent and the thickener is insoluble in the solvent. By using a CNT water dispersion that has CNTs and also a dispersant and thickener having the specific properties set forth above dissolved and/or dispersed in water, it is possible to form a conductive film having excellent film strength. Moreover, by using an electrode that includes this conductive film, it is possible to improve conversion efficiency and reliability of a solar cell.

Note that when a certain compound (dispersant or thickener) is said to be "soluble" in a solvent (polar aprotic substance) in the present disclosure, this means that the compound dissolves (insoluble matter is not visually observable) in the solvent with a concentration of 1 mass % at a temperature of 23° C., and when a certain compound is said to be "insoluble" in a solvent (polar aprotic substance), this means that the compound does not dissolve (insoluble matter is visually observable) in the solvent with a concentration of 1 mass % at a temperature of 23° C. even after 24 hours of stirring.

In the presently disclosed carbon nanotube water dispersion, the polar aprotic substance may be one or more selected from the group consisting of acetonitrile, γ-butyrolactone, 3-methoxypropionitrile, and triethylene glycol monomethyl ether.

In the presently disclosed carbon nanotube water dispersion, the dispersant and the thickener are preferably each formed of a non-ionic polymer. By using a non-ionic polymer as the dispersant and also using a non-ionic polymer as the thickener, it is possible to even further improve film strength of a conductive film while also further increasing conversion efficiency and reliability of a solar cell.

In the presently disclosed carbon nanotube water dispersion, the dispersant is preferably a copolymer of styrene and methoxy polyethylene glycol methacrylate. By using a copolymer of styrene and methoxy polyethylene glycol methacrylate as the dispersant, it is possible to further improve film strength of a conductive film.

Moreover, the present disclosure aims to advantageously solve the problem set forth above, and a presently disclosed conductive film is obtained using any one of the carbon nanotube water dispersions set forth above. A conductive film that is formed from the CNT water dispersion set forth above has excellent film strength. Moreover, by producing an electrode using this conductive film, it is possible to improve conversion efficiency and reliability of a solar cell.

Furthermore, the present disclosure aims to advantageously solve the problem set forth above, and a presently disclosed electrode comprises the conductive film set forth above. An electrode that includes the conductive film set forth above can cause a solar cell to display excellent conversion efficiency while also ensuring reliability of the solar cell.

Also, the present disclosure aims to advantageously solve the problem set forth above, and a presently disclosed solar cell comprises the electrode set forth above. A solar cell that includes the electrode set forth above has excellent conversion efficiency and reliability.

Advantageous Effect

According to the present disclosure, it is possible to provide a carbon nanotube water dispersion with which it is possible to form a conductive film that has excellent film strength and can cause a solar cell to display excellent conversion efficiency and reliability.

Moreover, according to the present disclosure, it is possible to provide a conductive film that has excellent film strength and can cause a solar cell to display excellent conversion efficiency and reliability.

Furthermore, according to the present disclosure, it is possible to provide an electrode that can cause a solar cell to display excellent conversion efficiency while also ensuring reliability of the solar cell.

Also, according to the present disclosure, it is possible to provide a solar cell having excellent conversion efficiency and reliability.

BRIEF DESCRIPTION OF THE DRAWING

In the accompanying drawing,
FIG. 1 illustrates schematic configuration of one example of a dye-sensitized solar cell.

DETAILED DESCRIPTION

The presently disclosed carbon nanotube water dispersion can be used in an application of producing an electrode of a solar cell and, more specifically, can be used to form a conductive film included in an electrode. Moreover, the presently disclosed conductive film is formed using the presently disclosed carbon nanotube water dispersion. Furthermore, the presently disclosed electrode includes the presently disclosed conductive film. Also, the presently disclosed solar cell includes the presently disclosed electrode.

(Carbon Nanotube Water Dispersion)

The presently disclosed CNT water dispersion contains a dispersant, a thickener, and water as a solvent, and may further contain other components as necessary.

A feature of the dispersant contained in the presently disclosed CNT water dispersion is that it is soluble in a solvent that is a polar aprotic substance contained in an electrolyte solution of a solar cell produced using an electrode that includes a conductive film formed from the CNT water dispersion, and a feature of the thickener contained in the presently disclosed CNT water dispersion is that it is insoluble in the aforementioned solvent. In other words, a feature of the dispersant is that it is soluble and a feature of the thickener is that it is insoluble when a "solvent" that is a polar aprotic substance used in an electrolyte solution is taken as a common standard for both thereof.

By using the presently disclosed CNT water dispersion, it is possible to form a conductive film that has excellent film strength and can cause a solar cell to display excellent conversion efficiency and reliability.

<Carbon Nanotubes>

Single-walled carbon nanotubes and/or multi-walled carbon nanotubes may be used as the CNTs without any specific limitations. However, the CNTs are preferably carbon nanotubes having from 1 to 5 walls, and are more preferably single-walled carbon nanotubes. One of these types of CNTs may be used individually, or two or more of these types of CNTs may be used in combination. When carbon nanotubes having fewer walls are used, the specific surface area of the carbon nanotubes is larger, and characteristics can be imparted to an obtained conductive film, such as catalytic activity in a situation in which the conductive film is used for an electrode of a solar cell, even with just a small amount of the carbon nanotubes.

The average diameter of the CNTs is preferably 1 nm or more, and is preferably 60 nm or less, more preferably 30 nm or less, and particularly preferably 10 nm or less. When the average diameter of the CNTs is 1 nm or more, dispersibility of the CNTs can be increased, and characteristics such as electrical conductivity can be stably imparted to a conductive film. Moreover, when the average diameter of the CNTs is 60 nm or less, characteristics can be efficiently imparted to an obtained conductive film, such as catalytic activity in a situation in which the conductive film is used for an electrode of a solar cell, even with just a small amount of the CNTs.

Note that the "average diameter of carbon nanotubes" referred to in the present disclosure can be determined by measuring the diameters (outer diameters) of 20 CNTs, for example, in a transmission electron microscope (TEM) image and then calculating a number-average value of the diameters.

The CNTs are preferably CNTs for which a ratio ($3\sigma/Av$) of a value ($3\sigma$) obtained by multiplying the diameter standard deviation ($\sigma$: sample standard deviation) of the CNTs by 3 relative to the average diameter ($Av$) of the CNTs is more than 0.20 and less than 0.80, more preferably CNTs for which $3\sigma/Av$ is more than 0.25, and particularly preferably CNTs for which $3\sigma/Av$ is more than 0.40. By using CNTs for which $3\sigma/Av$ is more than 0.20 and less than 0.80, it is possible to further improve the performance of a produced conductive film.

Note that the average diameter (Av) and the standard deviation (σ) of the CNTs may be adjusted by altering the production method or production conditions of the CNTs or may be adjusted by combining a plurality of types of CNTs that have been obtained by different production methods.

The CNTs that are typically used take a normal distribution when a plot is made of diameter measured as described above on a horizontal axis and probability density on a vertical axis, and a Gaussian approximation is made.

The average length of the CNTs is preferably 10 μm or more, more preferably 50 μm or more, and particularly preferably 80 μm or more, and is preferably 600 μm or less, more preferably 500 μm or less, and particularly preferably 400 μm or less. When the average length is 10 μm or more, electrical conduction paths can be formed in a conductive film with a small amount of the CNTs, and strength of the conductive film is high. Moreover, when the average length is 600 or less, coatability onto a substrate during application of the dispersion can be improved. Therefore, setting the average length of the CNTs within any of the ranges set forth above can sufficiently reduce surface resistivity of a conductive film and impart high catalytic activity to the conductive film.

Note that the "average length of carbon nanotubes" referred to in the present disclosure can be determined by measuring the lengths of 20 CNTs, for example, in a scanning electron microscope (SEM) image and then calculating an arithmetic mean value of the lengths.

The CNTs normally have an aspect ratio of more than 10. Note that the aspect ratio of CNTs can be determined by measuring the diameters and lengths of 100 randomly selected CNTs using a scanning electron microscope or a transmission electron microscope and then calculating an average value of the ratio of diameter and length (length/diameter).

The BET specific surface area of the CNTs is preferably 200 $m^2/g$ or more, more preferably 400 $m^2/g$ or more, and particularly preferably 600 $m^2/g$ or more, and is preferably 2,000 $m^2/g$ or less, more preferably 1,800 $m^2/g$ or less, and particularly preferably 1,600 $m^2/g$ or less. When the BET specific surface area of the CNTs is 200 $m^2/g$ or more, dispersibility of the CNTs can be increased, and characteristics can be imparted to an obtained conductive film, such as electrical conductivity and also catalytic activity in a situation in which the conductive film is used for an electrode of a solar cell, with a small amount of the CNTs. Moreover, when the BET specific surface area of the CNTs is 2,000 $m^2/g$ or less, characteristics can be imparted to an obtained conductive film, such as electrical conductivity and also catalytic activity in a situation in which the conductive film is used for an electrode of a solar cell, and coatability of the CNT water dispersion can be stabilized.

The term "BET specific surface area" as used herein refers to nitrogen adsorption specific surface area measured by the BET method.

The CNTs have preferably not undergone opening formation treatment, and a t-plot obtained from an adsorption isotherm for the CNTs preferably exhibits a convex upward shape. Note that a "t-plot" can be obtained by, in an adsorption isotherm of the CNTs measured by the nitrogen gas adsorption method, converting the relative pressure to an average thickness t (nm) of an adsorbed layer of nitrogen gas. Specifically, an average adsorbed nitrogen gas layer thickness t corresponding to a given relative pressure is determined from a known standard isotherm of average adsorbed nitrogen gas layer thickness t plotted against relative pressure P/P0, and the above-described conversion is made to obtain a t-plot for the CNTs (t-plot method of de Boer et al.).

In a substance having pores at its surface, the growth of the adsorbed layer of nitrogen gas is categorized into the following processes (1) to (3). The gradient of the t-plot changes in accordance with processes (1) to (3).

(1) A process in which a single molecule adsorption layer of nitrogen molecules is formed over the entire surface (2) A process in which a multi-molecule adsorption layer is formed and is accompanied by capillary condensation filling of pores (3) A process in which a multi-molecule adsorption layer is formed at a surface that appears to be non-porous due to the pores being filled by nitrogen In a t-plot having a convex upward shape, the plot is on a straight line passing through the origin in a region in which the average adsorbed nitrogen gas layer thickness t is small, but, as t increases, the plot deviates downward from the straight line. When CNTs have a t-plot shape such as described above, this indicates that the CNTs have a large ratio of internal specific surface area relative to total specific surface area and that numerous openings are formed in the CNTs.

A bending point of the t-plot for the CNTs is preferably within a range of $0.2 \leq t$ (nm) $\leq 1.5$, more preferably within a range of $0.45 \leq t$ (nm) $\leq 1.5$, and particularly preferably within a range of $0.55 \leq t$ (nm) $\leq 1.0$. When the bending point of the t-plot for the CNTs is within any of these ranges, dispersibility of the CNTs can be increased, and characteristics such as electrical conductivity of a conductive film can be enhanced with a small amount of the CNTs. More specifically, the CNTs may aggregate more easily and have lower dispersibility when the value of the bending point is less than 0.2, whereas the CNTs may become entangled with one another more easily and have reduced dispersibility when the value of the bending point is more than 1.5.

The "position of the bending point" is defined as an intersection point of a linear approximation A for the above-described process (1) and a linear approximation B for the above-described process (3).

A ratio (S2/S1) of internal specific surface area S2 of the CNTs relative to total specific surface area S1 of the CNTs determined from the t-plot is preferably not less than 0.05 and not more than 0.30. When the value of S2/S1 for the CNTs is within this range, dispersibility of the CNTs can be increased, and characteristics such as electrical conductivity of a conductive film can be enhanced with a small amount of the CNTs.

The total specific surface area S1 and the internal specific surface area S2 of the CNTs can be determined from the t-plot for the CNTs. Specifically, the total specific surface area S1 and external specific surface area S3 can first be determined from the gradient of the linear approximation of process (1) and the gradient of the linear approximation of process (3), respectively. The internal specific surface area S2 can then be calculated by subtracting the external specific surface area S3 from the total specific surface area S1.

Measurement of an adsorption isotherm of the CNTs, preparation of a t-plot, and calculation of the total specific surface area S1 and the internal specific surface area S2 based on t-plot analysis can be performed using a BELSORP®-mini (BELSORP is a registered trademark in Japan, other countries, or both), for example, which is a commercially available measurement apparatus produced by Bel Japan Inc.

The CNTs preferably have a radial breathing mode (RBM) peak when evaluated by Raman spectroscopy. Note that an RBM is not present in the Raman spectrum of CNTs having three or more walls.

A ratio (G/D ratio) of G-band peak intensity relative to D-band peak intensity in a Raman spectrum of the CNTs is preferably not less than 0.5 and not more than 10.0, and more preferably not less than 1.0 and not more than 5.0. When the G/D ratio is not less than 0.5 and not more than 10.0, characteristics can be imparted to an obtained conductive film, such as catalytic activity in a situation in which the conductive film is used for an electrode of a solar cell.

In elemental analysis of the CNTs by X-ray photoelectron spectroscopy (XPS), the amount of oxygen atoms relative to the total of carbon atoms and oxygen atoms is preferably 5 atom % or less, more preferably 2 atom % or less, and particularly preferably 1 atom % or less. When the amount of oxygen atoms is within the preferred range, characteristics can be imparted to an obtained conductive film, such as catalytic activity in a situation in which the conductive film is used for an electrode of a solar cell.

In CHN elemental analysis of the CNTs, the proportion constituted by carbon atoms is preferably 85 mass % or more, more preferably 90 mass % or more, even more preferably 95 mass % or more, and particularly preferably 98 mass % or more, and the proportion constituted by hydrogen atoms is preferably 1 mass % or less, more preferably 0.8 mass % or less, more preferably 0.3 mass % or less, and particularly preferably 0.1 mass % or less.

When the proportions constituted by carbon atoms and/or hydrogen atoms are within the preferred ranges, characteristics can be imparted to an obtained conductive film, such as catalytic activity in a situation in which the conductive film is used for an electrode of a solar cell.

The CNTs can be produced by a known CNT synthesis method such as arc discharge, laser ablation, or chemical vapor deposition (CVD) without any specific limitations. More specifically, the CNTs can be efficiently produced, for example, in accordance with a method in which, during synthesis of CNTs by chemical vapor deposition (CVD) by supplying a feedstock compound and a carrier gas onto a substrate having a catalyst layer for CNT production at the surface thereof, a trace amount of an oxidant (catalyst activating material) is provided in the system in order to dramatically improve the catalytic activity of the catalyst layer (super growth method; refer to WO2006/011655A1). Hereinafter, carbon nanotubes that are obtained by the super growth method are also referred to as "SGCNTs".

An assembly of CNTs produced by the super growth method may consist solely of SGCNTs or may include, in addition to SGCNTs, other carbon nanostructures such as non-circular tube-shaped carbon nanostructures.

Although no specific limitations are placed on the content of the CNTs in the CNT water dispersion, when the mass of the entire CNT water dispersion is taken to be 100 mass %, the content of the CNTs is preferably 0.001 mass % or more, more preferably 0.01 mass % or more, and even more preferably 0.1 mass % or more, and is preferably 30.0 mass % or less, more preferably 10.0 mass % or less, even more preferably 5.0 mass % or less, and particularly preferably 1.0 mass % or less.

<Dispersant>

The dispersant is not specifically limited so long as it is a compound that can disperse the above-described CNTs in water and that is soluble in a solvent (polar aprotic substance) in an electrolyte solution of a solar cell.

Examples of polar aprotic substances that can be used as a solvent of an electrolyte solution include five-membered ring cyclic carbonates such as ethylene carbonate and propylene carbonate; five-membered ring cyclic esters such as γ-butyrolactone and γ-valerolactone; aliphatic nitriles such as acetonitrile, 3-methoxypropionitrile, and methoxyacetonitrile; aliphatic chain ethers such as dimethoxyethane and triethylene glycol monomethyl ether; alicyclic ethers such as tetrahydrofuran and dioxane; aliphatic sulfones such as ethyl isopropyl sulfone; cyclic sulfones such as sulfolane; aliphatic sulfoxides such as dimethyl sulfoxide; dimethylformamide; and ethylmethylimidazolium bis(trifluoromethylsulfonyl)imide.

One of these polar aprotic substances may be used individually, or two or more of these polar aprotic substances may be used in combination. Of these polar aprotic substances, acetonitrile, γ-butyrolactone, 3-methoxypropionitrile, and triethylene glycol monomethyl ether are preferable.

Examples of dispersants that are soluble in at least acetonitrile, γ-butyrolactone, and 3-methoxypropionitrile include a copolymer of styrene and methoxy polyethylene glycol methacrylate, polyvinylpyrrolidone, polyoxyethylene alkyl ether (alkyl group carbon number: preferably not less than 8 and not more than 20), and polyoxyethylene alkylphenyl ether (alkyl group carbon number: preferably not less than 8 and not more than 9).

Examples of dispersants that are soluble in at least triethylene glycol monomethyl ether include a copolymer of styrene and methoxy polyethylene glycol methacrylate and polyvinylpyrrolidone.

Note that one dispersant may be used individually, or two or more dispersants may be used in combination. From a viewpoint of even further improving film strength of a conductive film while also further increasing conversion efficiency and reliability of a solar cell, the dispersant is preferably a non-ionic polymer, more preferably a copolymer of styrene and methoxy polyethylene glycol methacrylate or polyvinylpyrrolidone, and even more preferably a copolymer of styrene and methoxy polyethylene glycol methacrylate.

Although no specific limitations are placed on the content of the dispersant in the CNT water dispersion, the content of the dispersant per 100 parts by mass of the above-described CNTs is preferably 50 parts by mass or more, and more preferably 100 parts by mass or more, and is preferably 500 parts by mass or less, and more preferably 300 parts by mass or less. When the content of the dispersant is within any of the ranges set forth above, film strength of a conductive film can be even further improved while also further increasing conversion efficiency and reliability of a solar cell.

From a viewpoint of even further improving film strength of a conductive film while also further increasing conversion efficiency and reliability of a solar cell, n (integer) of an ethylene glycol chain section $(CH_2-CH_2-O)_n$ of a repeating unit derived from methoxy polyethylene glycol methacrylate in the copolymer of styrene and methoxy polyethylene glycol methacrylate is preferably not less than 1 and not more than 20, and more preferably not less than 4 and not more than 13.

Moreover, from a viewpoint of even further improving film strength of a conductive film while also further increasing conversion efficiency and reliability of a solar cell, the weight-average molecular weight of the copolymer of styrene and methoxy polyethylene glycol methacrylate is preferably not less than 10,000 and not more than 30,000.

Note that the weight-average molecular weight referred to in the present disclosure can be measured by gel permeation chromatography.

<Thickener>

The thickener is not specifically limited so long as it is a compound that can impart viscosity to the CNT water dispersion and that is insoluble in a solvent (polar aprotic substance) in an electrolyte solution of a solar cell.

Examples of thickeners that are insoluble in at least acetonitrile include cellulosic polymers (hydroxyethyl cellulose, carboxymethyl cellulose, etc.) and polyvinyl alcohol.

Examples of thickeners that are insoluble in at least γ-butyrolactone and 3-methoxypropionitrile include cellulosic polymers (hydroxyethyl cellulose, carboxymethyl cellulose, etc.), polyethylene oxide, and polyvinyl alcohol.

Examples of thickeners that are insoluble in at least triethylene glycol monomethyl ether include cellulosic polymers (hydroxyethyl cellulose, carboxymethyl cellulose, etc.) and polyethylene oxide.

Note that one thickener may be used individually, or two or more thickeners may be used in combination. The thickener is preferably a non-ionic polymer (polyethylene oxide, hydroxyethyl cellulose, etc.) from a viewpoint of further improving conversion efficiency of a solar cell.

Although no specific limitations are placed on the content of the thickener in the CNT water dispersion, the content of the thickener per 100 parts by mass of the above-described CNTs is preferably 5 parts by mass or more, and more preferably 10 parts by mass or more, and is preferably 100 parts by mass or less, and more preferably 50 parts by mass or less. When the content of the thickener is within any of the ranges set forth above, film strength of a conductive film can be even further improved while also further increasing conversion efficiency and reliability of a solar cell.

<Solvent>

It is necessary to use at least water as a solvent, though a mixed solvent of water and a solvent that is miscible with water may be used. Examples of solvents that are miscible with water include ethers (dioxane, tetrahydrofuran, methyl cellosolve, ethylene glycol dimethyl ether, ethylene glycol butyl ether, etc.), ether alcohols (ethoxyethanol, methoxyethoxyethanol, etc.), esters (methyl acetate, ethyl acetate, etc.), ketones (acetone, methyl isobutyl ketone, cyclohexanone, methyl ethyl ketone, etc.), alcohols (methanol, ethanol, isopropanol, propylene glycol, ethylene glycol, diacetone alcohol, phenol, etc.), lower carboxylic acids (acetic acid, etc.), amines (triethylamine, trimethanol amine, etc.), nitrogen-containing polar solvents (N,N-dimethylformamide, nitromethane, N-methylpyrrolidone, acetonitrile, etc.), and sulfur compounds (dimethyl sulfoxide, etc.). One of these solvents may be used individually, or two or more of these solvents may be used in combination.

<Other Components>

Examples of other components include inorganic materials such as silica, metal particles, binders, conductive additives, surfactants, defoamers, antioxidants, and preservatives. Known examples of these other components may be used as appropriate. Moreover, one of these other components may be used individually, or two or more of these other components may be used in combination.

<Production Method>

No specific limitations are placed on the method by which the CNT water dispersion is produced. For example, the CNT water dispersion can be obtained by performing known mixing/dispersing treatment with respect to the CNTs, dispersant, thickener, and other components that are used as necessary, in the presence of a solvent that includes water.

The known mixing/dispersing treatment may, for example, be a method using a wet jet mill such as a nanomizer or an ultimizer, a high-pressure homogenizer, an ultrasonic disperser, a ball mill, a sand grinder, a dyno-mill, a spike mill, a DCP mill, a basket mill, a paint conditioner, a high-speed stirring device such as a homo mixer, or the like.

The temperature during the mixing/dispersing treatment is not specifically limited but is normally not higher than the boiling point of the solvent including water, preferably 60° C. or lower, and more preferably 40° C. or lower, and is preferably −10° C. or higher, and more preferably 0° C. or higher. When the temperature is within any of these ranges, the solubility and structure of the dispersant can be controlled, and dispersibility of the CNTs can be improved.

The pH of the CNT water dispersion is not specifically limited but is preferably 0.1 or higher, more preferably 0.2 or higher, and particularly preferably 0.5 or higher, and is preferably lower than 7 (i.e., acidic), more preferably 6 or lower, even more preferably 5 or lower, further preferably 4 or lower, and particularly preferably 2.5 or lower. When the pH of the CNT water dispersion is within any of the ranges set forth above, stability of the CNT water dispersion can be ensured.

Note that the pH of the CNT water dispersion can be lowered through addition of an acidic substance. The acidic substance may be sulfuric acid, hydrochloric acid, nitric acid, citric acid, oxalic acid, tartaric acid, formic acid, phosphoric acid, or the like, for example.

(Conductive film)

The presently disclosed conductive film is formed using the presently disclosed CNT water dispersion set forth above. The presently disclosed conductive film has excellent film strength as a result of being formed from the presently disclosed CNT water dispersion.

Moreover, the presently disclosed conductive film can suitably be used as a constituent member of an electrode (photoelectrode or counter electrode) of a solar cell.

<Properties>

The thickness of the presently disclosed conductive film is not specifically limited but is normally not less than 100 nm and not more than 1 mm. In a case in which the conductive film is used for an electrode of a solar cell (particularly a dye-sensitized solar cell), the thickness of the conductive film is preferably not less than 0.01 μm and not more than 100 μm, more preferably not less than 0.1 μm and not more than 20 μm, and even more preferably not less than 0.5 μm and not more than 10 μm. When the thickness of the conductive film is within any of the ranges set forth above, this provides excellent electrical conductivity and catalytic performance as an electrode and an excellent balance of overall series resistance and the like as a module.

The surface resistivity of the presently disclosed conductive film is not specifically limited but may, for example, be not less than 0.01 Ω/sq. and not more than 1,000 Ω/sq., preferably not less than 0.1 Ω/sq. and not more than 100 Ω/sq., and more preferably not less than 0.5 Ω/sq. and not more than 20 Ω/sq.

Note that the surface resistivity of a conductive film can be measured by a method in accordance with JIS K7194 using a low resistivity meter (for example, a Loresta®-GP MCP-T610 (product name; Loresta is a registered trademark in Japan, other countries, or both) produced by Mitsubishi Chemical Analytech Co., Ltd.).

<Production Method>

No specific limitations are placed on the method by which the presently disclosed conductive film is produced so long as it is a method using the presently disclosed CNT water dispersion set forth above. For example, the presently disclosed conductive film can be produced through a step of applying the CNT water dispersion onto a substrate (application step) and a step of drying the CNT water dispersion on the substrate (drying step). Note that this production method may include steps other than the application step and the drying step (i.e., other steps).

<Application Step>

In the application step, the presently disclosed CNT water dispersion set forth above is applied onto a substrate.

The substrate can be selected as appropriate depending on the intended application without any specific limitations on the shape, constituent material, and size (thickness, etc.) thereof so long as the CNT water dispersion set forth above can be applied thereon and an obtained conductive film can be mounted thereon. However, it is preferable to use a support that is used in the presently disclosed electrode described further below.

A known application method can be adopted as the method by which the CNT water dispersion is applied onto the substrate.

Examples of application methods that may be used include dipping, roll coating, gravure coating, knife coating, air knife coating, roll knife coating, die coating, screen printing, spray coating, gravure offset, inkjet, and atomization. Of these application methods, screen printing is preferable.

Application may be performed a number of times as necessary rather than just once, and two different application methods may be combined.

The coating thickness (wet thickness) during application of the CNT water dispersion onto the substrate is not specifically limited so long as electrical conductivity of the obtained conductive film is ensured but is preferably 0.001 µm or more, more preferably 0.005 µm or more, and particularly preferably 0.01 µm or more, and is preferably 500 µm or less, more preferably 300 µm or less, and particularly preferably 200 µm or less.

The coating weight of the CNTs per unit area of the substrate when the CNT water dispersion is applied onto the substrate is preferably 0.001 mg/m$^2$ or more, more preferably 0.005 mg/m$^2$ or more, and particularly preferably 0.01 mg/m$^2$ or more, and is preferably 50 g/m$^2$ or less, more preferably 10 g/m$^2$ or less, and particularly preferably 3 g/m$^2$ or less.

<Drying Step>

In the drying step, a coating film of the CNT water dispersion that has been formed on the substrate in the application step is dried so as to obtain a laminate that includes the substrate and a dry film of the CNT water dispersion.

A known drying method may be adopted as the method by which the CNT water dispersion is dried on the substrate without any specific limitations. Examples of such drying methods include air drying, heated drying such as hot-roll drying, drying under reduced pressure, infrared irradiation, photoirradiation with a xenon lamp, a flashlamp, or the like, and electromagnetic wave heating with microwaves or the like.

The drying temperature is not specifically limited so long as it is a temperature at which the solvent including water can be removed by vaporization and at which deformation of the substrate does not occur. The drying temperature is preferably 0° C. or higher, more preferably 15° C. or higher, even more preferably 25° C. or higher, and particularly preferably 80° C. or higher, and is preferably 250° C. or lower, more preferably 200° C. or lower, and particularly preferably 150° C. or lower.

The drying time is not specifically limited but is preferably 0.1 minutes or more, and is preferably 150 minutes or less.

The drying atmosphere may be a humidified atmosphere, air, an inert gas such as nitrogen or argon, a reduced pressure atmosphere such as a vacuum, or the like without any specific limitations.

<Other Steps>

Examples of other steps include, but are not specifically limited to, a step of washing the dried film of the CNT water dispersion that has been obtained through the above-described drying step using a washing solvent (washing step). In other words, the dry film of the CNT water dispersion that is obtained through the above-described drying step can be used in that form as the presently disclosed conductive film, or a dry film that has further undergone a washing step can be used as the presently disclosed conductive film.

By performing a washing step, it is possible to at least partially remove the dispersant that is contained in the dry film of the CNT water dispersion.

No specific limitations are placed on the washing solvent that is used in the washing step so long as it is a washing solvent that can remove the dispersant through contact with the dry film, and water can be used as this washing solvent. However, in the present disclosure, it is preferable that the conductive film is produced without performing a washing step using water. This is because not only the dispersant, but also the thickener may be removed in a situation in which a washing step is performed using water.

It is preferable to use any of the previously described polar aprotic substances and more preferable to use at least any one of acetonitrile, γ-butyrolactone, 3-methoxypropionitrile, and triethylene glycol monomethyl ether as the washing solvent in the washing step in order to remove the dispersant while leaving behind the thickener, and it is particularly preferable to use acetonitrile from a viewpoint of ease of removal of the dispersant. Note that one washing solvent may be used individually, or two or more washing solvents may be used in combination.

The washing can be performed by a known method such as application, immersion, or the like without any specific limitations so long as it is a technique that enables contact of the above-described washing solvent with the conductive film. Also note that the washing may be divided up into a plurality of washings. Moreover, drying may be performed by a known method after washing.

(Electrode)

The presently disclosed electrode includes the presently disclosed conductive film set forth above. The presently disclosed electrode can cause a solar cell to display excellent conversion efficiency while also ensuring reliability of the solar cell as a result of including the presently disclosed conductive film.

Moreover, the presently disclosed electrode may suitably be used as an electrode (photoelectrode or counter electrode) of a dye-sensitized solar cell, and particularly as a counter electrode of a dye-sensitized solar cell.

Although the presently disclosed electrode is described below using, as an example, a case in which the electrode is a counter electrode of a dye-sensitized solar cell and in which the counter electrode includes the presently disclosed conductive film as a catalyst layer, the presently disclosed electrode is not limited to the following example.

<Counter Electrode>

The counter electrode is an electrode for efficiently passing, to an electrolyte layer, electrons that have entered from an external circuit. The counter electrode includes, for example, a support, a conductive layer disposed on the support, and a catalyst layer disposed on the conductive layer. In one suitable configuration according to the present disclosure, the presently disclosed conductive film is used as the catalyst layer of the counter electrode as previously described.

<<Support>>

A known support can be used as the support of the counter electrode. More specifically, a support formed of a transparent resin or a support formed of glass can be used as the support of the counter electrode, and, in particular, a support formed of a transparent resin can preferably be used as the support of the counter electrode. Examples of transparent resins that may be used include synthetic resins such as cycloolefin polymer (COP), polyethylene terephthalate (PET), polyethylene naphthalate (PEN), syndiotactic polystyrene (SPS), polyphenylene sulfide (PPS), polycarbonate (PC), polyarylate (PAr), polysulfone (PSF), polyester sulfone (PES), polyetherimide (PEI), and transparent polyimide (PI).

<<Conductive Layer and Catalyst Layer>>

A known conductive film can be used as the conductive layer of the counter electrode. Examples of known conductive films that may be used include a conductive film formed of an oxide such as indium tin oxide (ITO) or indium zinc oxide (IZO), a conductive film formed of a conductive polymer such as polyaniline or a polythiophene (for example, PEDOT [poly(3,4-ethylenedioxythiophene)]/PSS (polystyrene sulfonate)), or a conductive film (other than the presently disclosed conductive film) containing conductive carbon such as natural graphite, activated carbon, artificial graphite, graphene, or CNTs.

The presently disclosed conductive film is preferably used as the catalyst layer of the counter electrode as previously described.

Note that no specific limitations are placed on the methods by which the conductive layer and the catalyst layer are formed, and known techniques may be adopted. For example, in a case in which the presently disclosed conductive film is used as the catalyst layer, the presently disclosed CNT water dispersion may be applied onto a support having a conductive layer such as an ITO film (i.e., applied onto the ITO film) and may then be dried so as to stack the support, the conductive layer (ITO film), and the catalyst layer in this order.

(Solar Cell)

The presently disclosed solar cell includes the presently disclosed electrode set forth above. The presently disclosed solar cell has excellent conversion efficiency and reliability as a result of including the presently disclosed electrode set forth above. Moreover, the presently disclosed solar cell is preferably a dye-sensitized solar cell.

Although the presently disclosed solar cell is described below using, as an example, a case in which the solar cell is a dye-sensitized solar cell, the presently disclosed solar cell is not limited to the following example.

As illustrated in FIG. 1, a dye-sensitized solar cell 100 according to the present disclosure includes a photoelectrode 10, an electrolyte layer 20, and a counter electrode 30, and has the electrolyte layer 20 positioned between the photoelectrode 10 and the counter electrode 30. The photoelectrode 10 includes a support 10a, a conductive layer 10b disposed on the support 10a, a porous semiconductor fine particulate layer 10c formed of semiconductor fine particles, and a sensitizing dye layer 10d formed of a sensitizing dye that is adsorbed to the surfaces of the semiconductor fine particles in the porous semiconductor fine particulate layer 10c, and has the porous semiconductor fine particulate layer 10c and the sensitizing dye layer 10d formed on the conductive layer 10b. Moreover, the counter electrode 30 includes a support 30a, a conductive layer 30b disposed on the support 30a, and a catalyst layer 30c disposed on the conductive layer 30b. The conductive layer 10b of the photoelectrode 10 and the conductive layer 30b of the counter electrode 30 are connected via an external circuit 40.

<Photoelectrode and Counter Electrode>

The dye-sensitized solar cell that is an example of the presently disclosed solar cell includes the presently disclosed electrode set forth above as at least one of the photoelectrode 10 and the counter electrode 30. Moreover, the dye-sensitized solar cell preferably includes the presently disclosed conductive film as the catalyst layer 30c of the counter electrode 30 as previously described.

The photoelectrode 10 is an electrode that can release electrons to the external circuit upon receiving light. The photoelectrode 10 may, for example, include a support 10a, a conductive layer 10b disposed on the support, a porous semiconductor fine particulate layer 10c formed of semiconductor fine particles, and a sensitizing dye layer 10d formed of a sensitizing dye that is adsorbed to the surfaces of the semiconductor fine particles in the porous semiconductor fine particulate layer as previously described.

The support 10a and the conductive layer 10b of the photoelectrode may each be a known example thereof. More specifically, the support 10a of the photoelectrode can be the same as any of those previously described as the "support of the counter electrode", and the conductive layer 10b of the photoelectrode can be the same as any of those previously described as the "conductive layer of the counter electrode".

The porous semiconductor fine particulate layer 10c of the photoelectrode can be formed using particles of a metal oxide (semiconductor fine particles) such as titanium oxide, zinc oxide, or tin oxide, for example. One type of metal oxide particles may be used individually, or two or more types of metal oxide particles may be used in combination.

The porous semiconductor fine particulate layer 10c can be formed by pressing, hydrothermal decomposition, electrophoretic deposition, binder-free coating, or the like.

The sensitizing dye forming the sensitizing dye layer 10d that is adsorbed to the surfaces of the semiconductor fine particles in the porous semiconductor fine particulate layer 10c may be an organic dye such as a cyanine dye, a merocyanine dye, an oxonol dye, a xanthene dye, a squarylium dye, a polymethine dye, a coumarin dye, a riboflavin dye, or a perylene dye; a metal complex dye such as a phthalocyanine complex or porphyrin complex of a metal such as iron, copper, or ruthenium; or the like. One sensitizing dye may be used individually, or two or more sensitizing dyes may be used in combination.

Note that the sensitizing dye layer 10d can be formed by a method in which the porous semiconductor fine particulate layer 10c is immersed in a solution of the sensitizing dye, a method in which a solution of the sensitizing dye is applied onto the porous semiconductor fine particulate layer 10c, or the like, for example.

<Electrolyte Layer>

The electrolyte layer 20 typically contains a supporting electrolyte, a redox couple (i.e., a couple of chemical species that can be reversibly converted between in a redox reaction in the form of an oxidant and a reductant), a solvent, and so forth.

Examples of supporting electrolytes that may be used include salts having a cation such as a lithium ion, an imidazolium ion, or a quaternary ammonium ion. One of these supporting electrolytes may be used individually, or two or more of these supporting electrolytes may be used in combination.

The redox couple enables reduction of the oxidized sensitizing dye and examples thereof include chlorine compound/chlorine, iodine compound/iodine, bromine compound/bromine, thallium(III) ions/thallium(I) ions, ruthenium(III) ions/ruthenium(II) ions, copper(II) ions/copper(I) ions, iron(III) ions/iron(II) ions, cobalt(III) ions/cobalt(II) ions, vanadium(III) ions/vanadium(II) ions, manganic acid ions/permanganic acid ions, ferricyanide/ferrocyanide, quinone/hydroquinone, and fumaric acid/succinic acid. One of these redox couples may be used individually, or two or more of these redox couples may be used in combination.

Any of the previously described polar aprotic substances can be used as the solvent. One of these polar aprotic substances may be used individually, or two or more of these polar aprotic substances may be used in combination.

The electrolyte layer 20 can be formed by, for example, applying a solution (electrolyte solution) containing the constituent components of the electrolyte layer 20 onto the photoelectrode 10 or by preparing a cell including the photoelectrode 10 and the counter electrode 30 and then injecting the electrolyte solution into a gap between the electrodes.

(Solar Cell Module)

Presently disclosed solar cells such as described above can be connected in series and/or parallel so as to obtain a solar cell module.

For example, a solar cell module can be obtained by arranging presently disclosed solar cells in a flat plane or curved plane shape, providing non-conductive partitions between the cells, and electrically connecting photoelectrodes and counter electrodes of the cells using conductive members.

A solar cell module that includes the presently disclosed solar cell has excellent conversion efficiency and reliability.

Note that the number of solar cells used to form the solar cell module is not specifically limited and can be set as appropriate depending on the target voltage.

EXAMPLES

The following provides a more specific description of the present disclosure based on examples. However, the present disclosure is not limited to the following examples. In the following description, "%" and "parts" used in expressing quantities are by mass, unless otherwise specified. The following methods were used to perform evaluations in the present examples.

<External Appearance (Film Strength) of Conductive Film>

An arbitrary 1 $cm^2$ section of a conductive film of a counter electrode (PEN+ITO film+conductive film) was visually observed so as to confirm the presence or absence of pinholes of 1 mm or less in diameter and the presence or absence of peeling of the conductive film (lift-up from the ITO film). An evaluation was made by the following standard.

A: Neither pinholes nor peeling occur
B: Pinholes occur but peeling does not occur
C: Peeling occurs <Conversion Efficiency of Solar Cell>

A solar simulator (PEC-L11 produced by Peccell Technologies Inc.) in which an AM1.5 G filter was attached to a 150 W xenon lamp light source was used as a light source. The light intensity was adjusted to 1 sun (AM1.5 G, 100 $mW/cm^2$ [Class A of JIS C8912]). A produced solar cell was connected to a sourcemeter (Series 2400 SourceMeter produced by Keithley Instruments) and the following current/voltage characteristic was measured.

Output current was measured while changing bias voltage from 0 V to 0.8 V in 0.01 V units under 1 sun photoirradiation. The output current was measured for each voltage step by, after the voltage had been changed, integrating values from 0.05 seconds after the voltage change to 0.15 seconds after the voltage change. Measurement was also performed while changing the bias voltage in the reverse direction from 0.8 V to 0 V, and an average value of measurements for the forward direction and the reverse direction was taken to be the photoelectric current.

The conversion efficiency (%) was calculated from the measurement results of the current/voltage characteristic described above and was evaluated in accordance with the following standard.

A: Conversion efficiency of 4.0% or more
B: Conversion efficiency of not less than 3.5% and less than 4.0%
C: Conversion efficiency of less than 3.5%

<Reliability of Solar Cell>

A produced solar cell was loaded into an aluminum bag serving as a gas barrier and was left in a constant-temperature and constant-humidity tank (60° C.) for 500 hours. The conversion efficiency (%) for the solar cell that had been left was calculated in the same manner as described above and was evaluated in accordance with the following standard.

A: Conversion efficiency of 3.5% or more after being left for 500 hours
B: Conversion efficiency of not less than 3.0% and less than 3.5% after being left for 500 hours
C: Conversion efficiency of less than 3.0% after being left for 500 hours Example 1

<Production of CNT Water Dispersion>

A mixture was obtained by charging a 500 mL plastic bottle with 2.0 g of single-walled CNTs (produced by Zeon Corporation; product name: SG101), 6.0 g (300 parts per 100 parts of single-walled CNTs) in terms of pure content of a copolymer of styrene and methoxy polyethylene glycol methacrylate (produced by Kusumoto Chemicals, Ltd.; product name: DISPARLON® AQ-380 (DISPARLON is a registered trademark in Japan, other countries, or both); soluble in acetonitrile; weight-average molecular weight: 15,000; n of ethylene glycol chain section ($CH_2$—$CH_2$—$O)_n$: 9) as a dispersant, 1.0 g (50 parts per 100 parts of single-walled CNTs) of hydroxyethyl cellulose (produced by Daicel FineChem Ltd.; product name: SP600; insoluble in acetonitrile) as a thickener, and 400 g of pure water.

The obtained mixture was stirred by a Homo Mixer at 6,000 rpm for 30 minutes while cooling the plastic bottle to 25° C. in a water bath so as to obtain a crude dispersion.

The obtained crude dispersion was then subjected to 10 passes of treatment at 100 MPa in a wet jet mill (produced by Yoshida Kikai Co., Ltd.; product name: NanoVater®

(NanoVater is a registered trademark in Japan, other countries, or both)) while being cooled to 25° C. so as to obtain a CNT water dispersion.

<Production of Counter Electrode>

The CNT water dispersion produced as described above was applied onto ITO-PEN film (50 mm×50 mm, 15 Ω/sq.) by screen printing using a 100-mesh screen and was then dried in an air atmosphere at 125° C. for 15 minutes using an inert oven (produced by Yamato Scientific Co., Ltd.) so as to form a coating film. The coating film was dried under conditions of 2 hours at 60° C. under reduced pressure so as to produce a counter electrode that included a support formed of polyethylene naphthalate, an ITO film as a conductive layer, and the presently disclosed conductive film as a catalyst layer, in this order. This counter electrode was used to evaluate external appearance (film strength) of the conductive film. The result is shown in Table 1.

<Production of Photoelectrode>

A sensitizing dye solution (concentration: 0.3 mM) was prepared using a ruthenium complex (produced by Solaronix; product name: N719) as a sensitizing dye and ethanol as a solvent.

An isopropyl alcohol solution of titanium isopropoxide with a concentration of 5 mM was applied onto ITO-PEN film (50 mm×50 mm, 15 Ω/sq.) by bar coating and was then dried at 150° C. in an inert oven (produced by Yamato Scientific Co., Ltd.) for 15 minutes. A heat curable Ag paste (produced by Toyochem Co., Ltd.) was used to perform printing using a screen printing machine (SFA-PC610CTN produced by Seria Corporation) and was heated at 130° C. in an inert oven (produced by Yamato Scientific Co., Ltd.) for 30 minutes to form a lead-out electrode (thickness: 8 μm). In addition, an aqueous titanium oxide paste (PECC-AW1-01 produced by Peccell Technologies, Inc.) was applied by the screen printing machine and was then dried at 150° C. in an inert oven (produced by Yamato Scientific Co., Ltd.) for 15 minutes to form a porous semiconductor layer (titanium oxide layer thickness: 8 μm).

The ITO-PEN film with the porous semiconductor layer formed thereon was placed in the sensitizing dye solution (50 cm-square vat) that was produced as described above and was immersed therein at 40° C. for 2 hours. After this immersion, washing was performed using ethanol solution, and then drying was performed under reduced pressure at 40° C. for 24 hours to produce a photoelectrode.

<Production of Solar Cell>

An electrolyte solution was obtained by dissolving 0.05 mol/L of iodine, 0.1 mol/L of lithium iodide, 0.5 mol/L of t-butylpyridine, and 0.6 mol/L of 1,2-dimethyl-3-propylimidazolium iodide in acetonitrile as a solvent.

Inside a vacuum bonding apparatus, a sealant (polybutylene photocurable resin and 8 mass % of 25 μm insulating spacer resin) was applied onto the photoelectrode by a dispenser such as to pass around the perimeter of the photoelectrode once with a sealant width of 0.9 mm and height of 30 μm after bonding, and then the electrolyte solution obtained as described above was applied onto the photoelectrode. Bonding was then performed by setting up the counter electrode inside the vacuum bonding apparatus, performing overlapping thereof under vacuum, and then curing the sealant through UV irradiation by a metal halide lamp with an integrated light intensity of 3,000 mJ/cm$^2$. The vacuum was then released to atmospheric pressure to produce a dye-sensitized solar cell as a solar cell. This solar cell was used to evaluate conversion efficiency and reliability. The results are shown in Table 1.

Example 2

A CNT water dispersion, a counter electrode, a photoelectrode, and a solar cell were prepared and various evaluations were performed in the same way as in Example 1 with the exception that polyvinylpyrrolidone (produced by FUJIFILM Wako Pure Chemical Corporation; product name: Polyvinylpyrrolidone K30) was used instead of the copolymer of styrene and methoxy polyethylene glycol methacrylate as a dispersant in production of the CNT water dispersion. The results are shown in Table 1.

Example 3

A CNT water dispersion, a counter electrode, a photoelectrode, and a solar cell were prepared and various evaluations were performed in the same way as in Example 1 with the exception that carboxymethyl cellulose (produced by Daicel FineChem Ltd.; product name: CMC1380; insoluble in acetonitrile) was used instead of hydroxyethyl cellulose as a thickener in production of the CNT water dispersion. The results are shown in Table 1.

Example 4

A CNT water dispersion, a counter electrode, a photoelectrode, and a solar cell were prepared and various evaluations were performed in the same way as in Example 1 with the exception that γ-butyrolactone was used instead of acetonitrile as a solvent of the electrolyte solution in production of the solar cell. The results are shown in Table 1.

Note that the copolymer of styrene and methoxy polyethylene glycol methacrylate serving as a dispersant is soluble in γ-butyrolactone, whereas hydroxyethyl cellulose serving as a thickener is insoluble in γ-butyrolactone.

Example 5

A CNT water dispersion, a counter electrode, a photoelectrode, and a solar cell were prepared and various evaluations were performed in the same way as in Example 4 with the exception that polyethylene oxide (produced by Sumitomo Seika Chemicals Co., Ltd.; product name: PEO-8; insoluble in γ-butyrolactone) was used instead of hydroxyethyl cellulose as a thickener in production of the CNT water dispersion. The results are shown in Table 1.

Example 6

A CNT water dispersion, a counter electrode, a photoelectrode, and a solar cell were prepared and various evaluations were performed in the same way as in Example 1 with the exception that 3-methoxypropionitrile was used instead of acetonitrile as a solvent of the electrolyte solution in production of the solar cell. The results are shown in Table 1.

Note that the copolymer of styrene and methoxy polyethylene glycol methacrylate that served as a dispersant is soluble in 3-methoxypropionitrile, whereas hydroxyethyl cellulose that served as a thickener is insoluble in 3-methoxypropionitrile.

Example 7

A CNT water dispersion, a counter electrode, a photoelectrode, and a solar cell were prepared and various evaluations were performed in the same way as in Example 1 with the exception that triethylene glycol monomethyl ether was used instead of acetonitrile as a solvent of the electrolyte solution in production of the solar cell. The results are shown in Table 1.

Note that the copolymer of styrene and methoxy polyethylene glycol methacrylate serving as a dispersant is soluble in triethylene glycol monomethyl ether, whereas hydroxyethyl cellulose serving as a thickener is insoluble in triethylene glycol monomethyl ether.

Comparative Example 1

A CNT water dispersion, a counter electrode, a photoelectrode, and a solar cell were prepared and various evaluations were performed in the same way as in Example 1 with the exception that poly(sodium styrenesulfonate) (produced by Sigma-Aldrich; product name:

Poly(sodium 4-styrenesulfonate); insoluble in acetonitrile) was used instead of the copolymer of styrene and methoxy polyethylene glycol methacrylate as a dispersant and hydroxyethyl cellulose was not used as a thickener in production of the CNT water dispersion. The results are shown in Table 2.

Comparative Example 2

A CNT water dispersion, a counter electrode, a photoelectrode, and a solar cell were prepared and various evaluations were performed in the same way as in Example 1 with the exception that sodium polyacrylate (produced by Sigma-Aldrich; insoluble in acetonitrile) was used instead of the copolymer of styrene and methoxy polyethylene glycol methacrylate as a dispersant and hydroxyethyl cellulose was not used as a thickener in production of the CNT water dispersion. The results are shown in Table 2.

Comparative Example 3

A photoelectrode and a solar cell were prepared and various evaluations were performed in the same way as in Comparative Example 1 with the exception that a counter electrode was produced as described below. The results are shown in Table 2.

<Production of Counter Electrode>

The counter electrode used in Comparative Example 3 was obtained by further immersing a counter electrode obtained in the same way as in Comparative Example 1 in deionized water for 30 minutes and then drying the counter electrode in an air atmosphere at 125° C. for 15 minutes using an inert oven (produced by Yamato Scientific Co., Ltd.).

Comparative Example 4

A CNT water dispersion, a counter electrode, a photoelectrode, and a solar cell were prepared and various evaluations were performed in the same way as in Example 1 with the exception that hydroxyethyl cellulose was not used as a thickener in production of the CNT water dispersion. The results are shown in Table 2.

Comparative Example 5

A CNT water dispersion, a counter electrode, a photoelectrode, and a solar cell were prepared and various evaluations were performed in the same way as in Example 1 with the exception that polyethylene oxide (produced by Sumitomo Seika Chemicals Co., Ltd.; product name: PEO-8; soluble in acetonitrile) was used instead of hydroxyethyl cellulose as a thickener in production of the CNT water dispersion. The results are shown in Table 2.

In Tables 1 and 2, shown below:

"AQ380" indicates copolymer of styrene and methoxy polyethylene glycol methacrylate;
"PVP" indicates polyvinylpyrrolidone;
"SPS" indicates poly(sodium styrenesulfonate);
"SPA" indicates sodium polyacrylate;
"HEC" indicates hydroxyethyl cellulose;
"CMC" indicates carboxymethyl cellulose;
"PEO" indicates polyethylene oxide;
"γ-BL" indicates γ-butyrolactone;
"3-MPN" indicates 3-methoxypropionitrile; and
"TGME" indicates triethylene glycol monomethyl ether.

TABLE 1

|  |  | Example 1 | Example 2 | Example 3 | Example 4 | Example 5 | Example 6 | Example 7 |
|---|---|---|---|---|---|---|---|---|
| Dispersant | Type | AQ380 | PVP | AQ380 | AQ380 | AQ380 | AQ380 | AQ380 |
|  | Property in solvent of electrolyte solution | Soluble | Soluble | Soluble | Soluble | Soluble | Soluble | Soluble |
| Thickener | Type | HEC | HEC | CMC | HEC | PEO | HEC | HEC |
|  | Property in solvent of electrolyte solution | Insoluble | Insoluble | Insoluble | Insoluble | Insoluble | Insoluble | Insoluble |
|  | Washing step | No | No | No | No | No | No | No |
|  | Solvent of electrolyte solution | Acetonitrile | Acetonitrile | Acetonitrile | γ-BL | γ-BL | 3-MPN | TGME |
|  | External appearance (film strength) | A | B | A | A | A | A | A |
|  | Conversion efficiency | A | A | B | A | B | A | A |
|  | Reliability | A | A | A | A | A | A | A |

TABLE 2

|  |  | Comparative Example 1 | Comparative Example 2 | Comparative Example 3 | Comparative Example 4 | Comparative Example 5 |
|---|---|---|---|---|---|---|
| Dispersant | Type | SPS | SPA | SPS | AQ380 | AQ380 |
|  | Property in solvent of electrolyte solution | Insoluble | Insoluble | Insoluble | Soluble | Soluble |
| Thickener | Type | None | None | None | None | PEO |
|  | Property in solvent of electrolyte solution | — | — | — | — | Soluble |

TABLE 2-continued

|  | Comparative Example 1 | Comparative Example 2 | Comparative Example 3 | Comparative Example 4 | Comparative Example 5 |
| --- | --- | --- | --- | --- | --- |
| Washing step | No | No | Yes | No | No |
| Solvent of electrolyte solution | Acetonitrile | Acetonitrile | Acetonitrile | Acetonitrile | Acetonitrile |
| External appearance (film strength) | A | A | C | A | A |
| Conversion efficiency | C | C | B | C | B |
| Reliability | B | B | B | C | C |

It can be seen from Tables 1 and 2 that it is possible to produce a conductive film having excellent film strength and a solar cell having excellent conversion efficiency and reliability by using the CNT water dispersions of Examples 1 to 7.

INDUSTRIAL APPLICABILITY

According to the present disclosure, it is possible to provide a carbon nanotube water dispersion with which it is possible to form a conductive film that has excellent film strength and can cause a solar cell to display excellent conversion efficiency and reliability.

Moreover, according to the present disclosure, it is possible to provide a conductive film that has excellent film strength and can cause a solar cell to display excellent conversion efficiency and reliability.

Furthermore, according to the present disclosure, it is possible to provide an electrode that can cause a solar cell to display excellent conversion efficiency while also ensuring reliability of the solar cell.

Also, according to the present disclosure, it is possible to provide a solar cell that has excellent conversion efficiency and reliability.

REFERENCE SIGNS LIST 10 photoelectrode
30 counter electrode
20 electrolyte layer
10a, 30a support
10b, 30b conductive layer
10c porous semiconductor fine particulate layer
10d sensitizing dye layer
30c catalyst layer
40 circuit
100 dye-sensitized solar cell

The invention claimed is:

1. A carbon nanotube water dispersion for an electrode of a solar cell that includes an electrolyte solution containing a polar aprotic substance as a solvent, the carbon nanotube water dispersion comprising carbon nanotubes, a dispersant, a thickener, and water, wherein
the dispersant is soluble in the solvent and the thickener is insoluble in the solvent.

2. The carbon nanotube water dispersion according to claim 1, wherein the polar aprotic substance is one or more selected from the group consisting of acetonitrile, γ-butyrolactone, 3-methoxypropionitrile, and triethylene glycol monomethyl ether.

3. The carbon nanotube water dispersion according to claim 1, wherein the dispersant and the thickener are each formed of a non-ionic polymer.

4. The carbon nanotube water dispersion according to claim 1, wherein the dispersant is a copolymer of styrene and methoxy polyethylene glycol methacrylate.

5. A conductive film obtained using the carbon nanotube water dispersion according to claim 1.

6. An electrode comprising the conductive film according to claim 5.

7. A solar cell comprising the electrode according to claim 6.

* * * * *